(12) United States Patent
Nishiguchi et al.

(10) Patent No.: US 7,214,412 B2
(45) Date of Patent: May 8, 2007

(54) MAGENTA TONER AND METHOD FOR PRODUCING SAME

(75) Inventors: Tetsuya Nishiguchi, Tokyo (JP); Hidehiko Nonaka, Ibaraki (JP); Shingo Ichimura, Ibaraki (JP)

(73) Assignees: Kabushiki Kaisha Meidensha, Tokyo (JP); National Institute of Advanced Industrial Science, Tokyo (JP)

( * ) Notice: Subject to any disclaimer, the term of this patent is extended or adjusted under 35 U.S.C. 154(b) by 107 days.

(21) Appl. No.: 10/494,691

(22) PCT Filed: Oct. 31, 2002

(86) PCT No.: PCT/JP02/11361

§ 371 (c)(1),
(2), (4) Date: Nov. 8, 2004

(87) PCT Pub. No.: WO2004/036317

PCT Pub. Date: Apr. 29, 2004

(65) Prior Publication Data

US 2005/0191864 A1    Sep. 1, 2005

(30) Foreign Application Priority Data

Nov. 8, 2001  (JP) ............................. 2001-343237
Aug. 23, 2002  (JP) ............................. 2002-243242

(51) Int. Cl.
*C30B 25/12* (2006.01)

(52) U.S. Cl. ...................................... 427/553; 438/763

(58) Field of Classification Search ................ 438/763; 427/553
See application file for complete search history.

(56) References Cited

FOREIGN PATENT DOCUMENTS

| JP | 62-237733 A | 10/1987 |
|----|-------------|---------|
| JP | 63-41028 A | 2/1988 |
| JP | 5-17164 A | 1/1993 |
| JP | 6-48682 B2 | 6/1994 |
| JP | 7-24266 B2 | 3/1995 |
| JP | 8-335576 A | 12/1996 |
| JP | 11-204518 A | 7/1999 |
| JP | 2000-286251 A | 10/2000 |
| JP | 2000-349079 A | 12/2000 |
| JP | 2001-30589 A | 2/2001 |
| JP | 2001-179079 A | 7/2001 |

*Primary Examiner*—Felisa Hiteshew
(74) *Attorney, Agent, or Firm*—Foley & Lardner LLP

(57) ABSTRACT

When exposing a sample to be oxidized 10 to ozone gas so as to form an oxide film on the surface of the sample, an area to be oxidized is heated locally. Local heating is carried out with a light source 23 for irradiating infrared light the area to be oxidized of the sample on the susceptor 21, and heating means for heating the susceptor. Moreover, when exposing the sample to be oxidized to ozone gas, ozone gas is supplied to the sample while heating the sample under a given pressure. Said pressure is adjusted at 100–44,000 Pa, for example. The flow rate of ozone gas is adjusted, preferably, so that flow of ozone gas in a furnace 20 forms laminar flow. Moreover, it is desirable to provide a light source for emitting ultraviolet light. The light source for emitting ultraviolet light is arranged to irradiate the upstream side of the susceptor 21, for example.

22 Claims, 11 Drawing Sheets

MAGENTA TONER AND METHOD FOR PRODUCING SAME

TECHNICAL FIELD

The present invention relates to a method of forming an oxide film on the surface of a sample to be oxidized and a system thereof, and more particularly, to a method of forming with ozone gas an oxide film on the surface of a sample to be oxidized and a system thereof.

As having strong oxidizing force, ozone (atomic symbol: $O_3$) is used in various fields such as sewage/clean water treatment, ashing processing of a semiconductor photo resist, and the like. Ozone is generated using an industrial ozone generator, i.e. ozonizer so called. The generator generates mixture gas of ozone and oxygen from oxygen gas by electric discharge. However, since mixture gas containing ozone of a given concentration (about 9 volume %) or more at ordinary temperature and under ordinary pressure involves a danger of explosion, the ozone concentration in mixture gas generated is restrained typically at about several % or less.

On the other hand, there is a method that, using a difference in vapor pressure between ozone and oxygen at low temperature, only ozone in ozone mixture gas generated by the ozonizer is condensed into liquid to obtain high-purity ozone gas. It is expected that achievement of the high purity allows that ozone to exert stronger oxidizing force than that of several % of ozone gas.

BACKGROUND ART

A current semiconductor device includes, as a component element, a MOS device such as MOSFET (Metal-Oxide-Semiconductor Field-Effect Transistor) or the like. With a gate oxide film of a silicon MOS device, a thickness reduction is accelerated with the requirements of integration and high performance of the circuit. It is expected that the thickness comes to 1 nm or less from 2010 onward.

The current silicon oxidizing method rely on mainly dry $O_2$ oxidation and wet $O_2$ oxidation, by which, however, device formation having long TDDB (Time-Dependent Dielectric Breakdown) life and hot carrier resistance is not carried out easily. Further, as a thickness reduction of an oxide film progresses, there arose problems of quality degradation due to existence of a silicon sub-oxide layer (structural transition layer) produced in the vicinity of an interface between an Si substrate and an oxide film and thermal degradation due to high-temperature heat treatment (1,000° C., for example). Furthermore, with a thin film of 10 nm or less thickness, it is known that existence of a transition layer (incomplete oxidation layer) of an interface between a silicon oxide film and a silicon causes start of degradation of the characteristics of withstand voltage, leak current, and the like.

In order to solve those problems, it is studied oxidation with oxygen gas containing ozone of several % concentration by using an ozonizer. When colliding with the Si surface, ozone is dissociated to generate oxygen radicals having higher reactivity than that of oxygen molecules, allowing achievement of a high-quality oxide film with less sub-oxide at low temperature (Journal of Applied Physics 87, 8184 (2000), for example). Moreover, another method copes with the problems by carrying out post annealing in a nitrogen-gas atmosphere or the like to reduce electron trap site and hole trap site in the film.

On the other hand, with a tunnel oxide film for flush memory, a high electric field (>6 MV/cm) is applied to the thin film of 10 nm or less to carry out writing/reading of information (electronic loading/unloading), thus requiring high withstand voltage of the oxide film and high reliability thereof at voltage application (economic stability). Imperfection (existence of a defect and a sub-oxide layer) of the oxide film also becomes a cause of lowering the reliability.

A silicon oxide skin for TFT (Thin Film Transistor) has a film formed on a glass substrate, requiring processing at 400° C. or less. Due to relatively large required film thickness (50–100 nm), it adopts currently principally a chemical vapor deposition (CVD) method. In addition, silicon oxide films on silicon are used as insulating films (device separating film) in various spots of silicon devices. Though they are prepared principally by the CVD process, it is needed achievement of high quality and enhancement in reliability. Preparation of some insulating films is carried out at the final stage of process, and it is preferable to lower the preparation temperature as much as possible so as not to cause damage to device parts already prepared.

The concentration of ozone obtained by passing high-purity oxygen gas through an ozonizer is low or 5–10%. And ozone is dissociative gas, which has the property of causing intense dissociation by mutual collision as the temperature becomes high. As a result, the ozone concentration is lowered before ozone reaches a sample to be oxidized, and it becomes uneven between upstream and downstream ends of a heated wafer. With this, oxidizing force of ozone cannot sufficiently be exploited, raising problems such as uneven thickness of an oxide film and the like.

Moreover, some materials (metal, particularly) used in an ozone supply system and an ozone oxidation-processing system are apt to reaction and corrosion with ozone. When adopting such materials for a gas supply line, a reaction product (metallic oxide having lower vapor pressure, particularly) is supplied, together with ozone, to a sample to be oxidized, becoming a cause of lowering the quality of an oxide film.

Incidentally, plasma-oxygen oxidation and ultraviolet-light irradiation oxidation are currently known as a process for forming a good-quality oxide film from (poly)silicon by low-temperature (oxidation or reforming). In the former, plasma is generated in the atmosphere containing oxygen molecules to generate active oxidation seeds having high kinetic energy (>10 eV), such as oxygen-atom (molecule) ion and neutral oxygen atom (molecule), which are used as oxidation (diffusion) seeds to thereby realize a reduction in oxidation temperature. In the latter, ultraviolet light (excimer UV lamp, for example) is introduced into the oxygen-gas atmosphere to generate oxygen radicals, which are used as oxidation seeds.

However, the former raises a problem of damage to a film by ion oxidation seeds having high energy. On the other hand, the latter raises a problem that the absolute generation amount of radicals (free radicals) is restricted by the photon density of ultraviolet light. Moreover, both raise a problem that the high reactivity between generated active seeds (ion or radical) prevents the active seeds from being effectively led to a substrate to be processed, or requires a contrivance for system layout to lead them thereto.

Further, in recent years, with a polysilicon oxide film for TFT, which is formed by CVD, there arise problems of imperfection of the oxide film, such as greater defects of a $SiO_2/Si$ interface as compared with a thermal oxide film, lower withstand voltage due to film composition without perfect $SiO_2$, and the like. As a result, oxidation using the radicals as oxidation seeds is often carried out before or during CVD process for the purpose of reforming of the interface. By way of example, it is reported that when processing is carried out in the oxygen-radical atmosphere during CVD process and after film deposition of about 6 nm thickness, oxygen atoms reach the interface to achieve film reforming (Chung Yi et al., J. Vac. Sci. Technol. B 19, 2067 (2001), for example).

However, this method requires a plurality of processes of oxidation processing. This becomes a cause of lowering the throughput.

DISCLOSURE OF THE INVENTION

The present invention is made in view of the above circumstances, and has as an object to provide an oxide-film forming method and a system thereof, which allow high-speed and efficient formation and improvement in an oxide film with uniform film thickness at relatively low temperature, and enhancement in electric characteristics thereof.

In order to achieve this object, the present invention is characterized by the following:

An oxide film forming method wherein ozone gas is exposed to a sample to be oxidized to thereby form an oxide film on a surface of the sample, characterized in that ozone gas is supplied to the sample to be oxidized while locally heating an area to be oxidized of the sample.

The oxide film forming method as specified above characterized in that infrared light is irradiated to the area to be oxidized of the sample to be oxidized to thereby heat the area locally.

The oxide film forming method as specified above characterized in that the sample to be oxidized is disposed on a susceptor, wherein the susceptor is heated to thereby heat the area to be oxidized of the sample to be oxidized locally.

The oxide film forming method as specified above characterized in that when exposing the sample to be oxidized to ozone gas, ozone gas is supplied to the sample while locally heating the sample under a given pressure.

The oxide film forming method as specified above characterized in that said pressure is adjusted to thereby control an oxidizing velocity of the sample to be oxidized.

The oxide film forming method as specified above characterized in that said pressure is adjusted to 100–44,000 Pa.

The oxide film forming method as specified above characterized in that ozone gas includes a gas of about 100% ozone concentration.

The oxide film forming method as specified above characterized in that ozone gas is supplied to the area to be oxidized of the sample in the state of laminar flow.

The oxide film forming method as specified above characterized in that ultraviolet light is further irradiated to the area to be oxidized of the sample to be oxidized.

The oxide film forming method as specified above characterized in that ozone gas is exposed to ultraviolet light, then supplied to the area to be oxidized of the sample.

The oxide film forming method as specified above characterized in that the sample to be oxidized is loaded in a cold-wall type processing furnace, wherein ozone gas is supplied to the processing furnace.

The An oxide film forming system wherein ozone gas is exposed to a sample to be oxidized to thereby form an oxide film on a surface of the sample, characterized in that it comprises a furnace to which ozone gas is supplied, a susceptor arranged in the furnace and having the sample to be oxidized disposed thereon, and heating means for heating the sample locally.

The oxide film forming system as specified above characterized in that the heating means include a light source for emitting infrared rays, wherein they are irradiated to the sample to be oxidized to thereby heat the sample locally.

The oxide film forming system as specified above characterized in that the heating means heat said susceptor to thereby heat the sample locally.

The oxide film forming system as specified above characterized in that it comprises a light source for emitting ultraviolet light.

The oxide film forming system as specified above characterized in that the light source for emitting ultraviolet light is arranged to irradiate the upstream side of the susceptor.

The oxide film forming system as specified above characterized in that it comprises pressure adjusting means for adjusting a pressure value within said processing furnace to control an oxidizing velocity of the ample to be oxidized.

With the oxide-film forming method and the system thereof according to the present invention, since ozone gas is supplied to a sample to be oxidized while locally heating an area to be oxidized of the sample, thermal dissociation of ozone is restrained to a minimum on the upstream side of the sample. Moreover, since ozone can be supplied to the sample to be oxidized with high concentration maintained, high-speed and efficient formation of an oxide film is achieved. Ozone gas exists stably without little dissociation under the conditions that the ambient temperature is 100° C. or less, where reaction between ozone molecules is very slow in the gaseous phase. According to the present invention, since only the sample to be oxidized is heated, ozone gas of roughly 100% concentration can be supplied to the surface to be processed without any limitation on the structure of the processing furnace. Local heating includes an indirect heating method and a direct heating method. Indirect heating includes a heating method with infrared rays, for example. Direct heating includes a method of directly heating a susceptor by radiation heat from heating means such as a heater.

Further, according to the present invention, oxygen radicals having stronger oxidizing force than that of oxygen molecules produced when ozone contact the surface of a sample to be oxidized are provided as oxidation seeds to the sample, allowing more efficient processing than that of thermal oxidation using oxygen molecules. Moreover, oxygen radicals are more diffusible than oxygen molecules, so that even if the processing temperature is lower than the conventional temperature conditions, a good-quality oxide film can be formed with the complete oxidation state maintained up to an interface of the sample to be oxidized (complete oxidation processing). Then, appropriate adjustment of the pressure within the reaction system having the sample to be oxidized arranged therein allows an increase in amount of oxygen radicals, resulting in achievement of high-speed oxidation processing of the sample.

Still further, according to the present invention, due to achievement of the oxidizing velocity which does not depend on the face azimuth of a sample to be oxidized, uniform oxidation processing is possible to the sample to be oxidized having various face azimuths, obtaining an oxide film of a desired film thickness.

Furthermore, according to the present invention, oxygen atoms in the excited state produced in combination with ultraviolet irradiation and by reaction of ozone with ultraviolet light have stronger oxidizing force than that of ozone, allowing further speedup of oxidation processing when they are supplied to the surface of a sample to be oxidized.

Further, according to the present invention, it is desirable to adopt quartz or stainless steel as a material of a pipe for supplying ozone gas, furnace to which gas is supplied (refer hereafter to as oxidizing furnace), and susceptor. Because quartz and stainless steel are higher in ozone resistance, and quartz is higher in transmissivity of infrared and ultraviolet rays, allowing preservation of higher ozone remaining rate even if ozone remains. When carrying out oxidation processing of a sample to be oxidized, preliminary exposure of the ozone-gas supply line to ozone gas allows preservation of higher ozone remaining rate in the pipe and the furnace.

Still further, if a sample to be oxidized is disposed in the susceptor to conceal it so as to prevent exposure of a high-temperature portion of the susceptor heated locally, it can be prevented dissociation of ozone due to ozone directly striking the surface of the susceptor. Moreover, divergence of heat provided for local heating can be restrained to a minimum, resulting in reduced energy loss during local heating.

It may be adopted known infrared and ultraviolet lamps or lasers as the light sources for emitting infrared and ultraviolet lights. The light source is provided with a reflecting mirror as required to allow irradiation in such a way as to converge on an area to be oxidized on the susceptor.

Further, according to the present invention, ozone gas in the laminar state is supplied to an object to be oxidized, allowing more efficient and uniform formation of an oxide film. Specifically, the flow rate of ozone gas is adjusted so that the Reynolds number of ozone-gas fluid in the oxidizing furnace is equal to a given value (0.1 Re, for example) smaller than a critical Reynolds number Re (Re=$(\rho \cdot v \cdot h)/\mu$, where Re: Reynolds number, $\rho$: fluid density, v: flow velocity (flow rate/sectional area of the oxidizing furnace), and h: narrowing effective width. More specifically, the supply flow rate of ozone gas, pressure within the furnace, and the like are monitored, for example, which are provided for adjustment of the Reynolds number. Then, in some cases, the angle of installation of the susceptor in the oxidizing furnace is also adjusted as required.

Moreover, it is desirable to construct the oxidizing furnace so as to extend the absorption area of ultraviolet light to the neighborhood of the surface of oxidized and to adjust the pressure within the furnace and the flow velocity of ozone gas in accordance with the quantity of light of the light source. Specifically, the oxidizing furnace is formed in double structure in which gas which does not absorb ultraviolet light is supplied to the outer peripheral portion to which ozone gas is not supplied, allowing achievement of photodissociation in the vicinity of the surface to be oxidized. Thus, even if ozone highly reactive with oxygen atoms remains therearound, excited-state oxygen atoms can efficiently be guided to the surface to be oxidized. It is more desirable that the light source is of the quantity of light which can be set freely. Then, if, in the ultraviolet-light irradiation area, for example, the quantity of light is adjusted so that the number of photons is relatively greater than that of ozone molecules entering this area every minute (flow velocity) and that of ozone molecules remaining therein in a steady way (pressure), excited-state oxygen atoms can be provided to the surface to be oxidized without being dissociated by ozone, achieving more effective oxidation processing. In this case, the light source for irradiating ultraviolet light may arbitrarily be provided in the oxidizing furnace on the upstream side of the susceptor.

It is noted that the present invention is not limited to the above semiconductor substrate as an object to be oxidized, and can be applied to other material than the semiconductor substrate which requires oxide-film processing. Moreover, the present invention can also be applied to an oxide film already formed, achieving improvement in quality of the oxide film and enhancement in electric characteristics thereof.

BEST MODE FOR CARRYING OUT THE INVENTION

The modes of operation of the present invention will be described hereafter with reference to the drawings.

Figure 1:
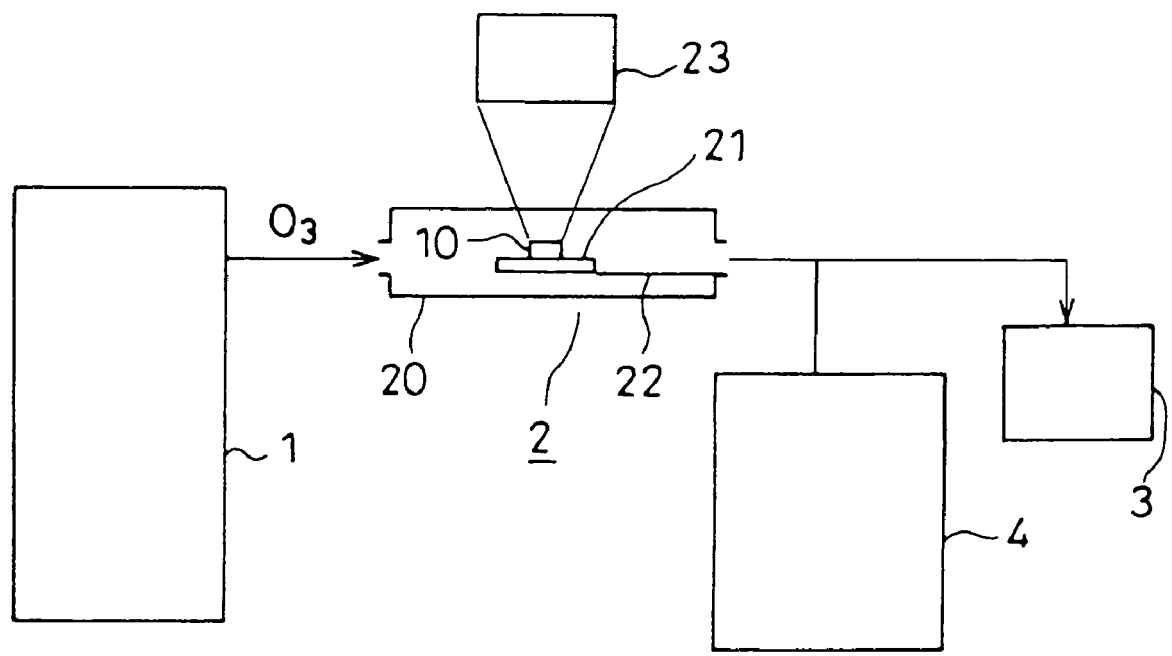
FIG. 1 is a schematic structural view showing an example of mode of operation of an oxide-film forming method according to the present invention.

When creating an oxide-film forming method according to the present invention, in order to select materials of an oxidizing furnace and know a tolerance of the materials to allow maximum restraining of the ozone dissociation rate sustained until ozone reaches a sample to be oxidized, the inventors have conducted the following preliminary experiments:

(1) Verification of a Difference in Ozone Dissociation Rate Between Materials of an Oxidizing Furnace FIG. 1 shows an outline of the preliminary experiments. A susceptor 21 was arranged in the center of a synthetic-quartz-made oxidizing furnace 2 (effective width of 30 mm and length of 250 mm) which allows roughly complete transmission of infrared rays, and a sample made of an arbitrary material was disposed thereon. While heating the sample on the susceptor 21 by condensing and applying infrared rays from the outside, a given amount of ozone was supplied to the oxidizing furnace 2. The ozone concentration in gas discharged from the oxidizing furnace was measured to check the ozone remaining rate. It is assumed that an area other than that of the sample disposed on the susceptor 21 is roughly at a room temperature. The temperature of the sample was measured with a chromel-almel thermocouple.

Determination of the ozone concentration relies on a method based on Japanese Patent Application 2001-30589 (Method and System for Measuring Mixture Gas) precedently devised and filed by the inventors. This determination method uses a difference in meting point between various gases in mixture gas. Specifically, mixture gas to be measured is introduced into a container containing inactive gas, which is cooled down to be condensed on a target. Then, the condensed liquid or solid is gradually warmed up with a heater and the like to separately vaporize the gases having different melting points. The absolute amount, mixture ratio, and the like of the gases are obtained by the product of pressure variations in the container (refer hereafter to as low-temperature adsorption separation method).

Figure 2:
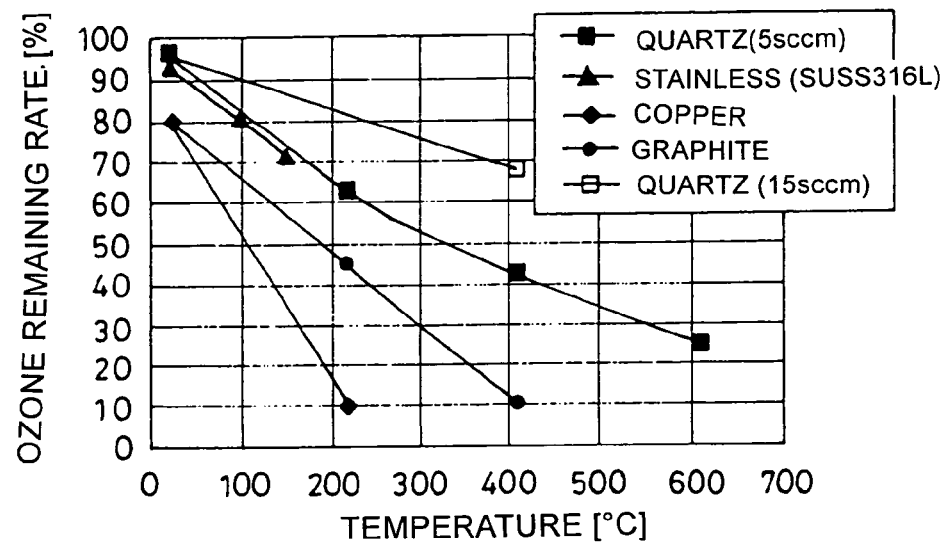
FIG. 2 is a characteristic view showing variations in ozone remaining rate when samples heated at arbitrary temperatures are exposed to ozone gas.

FIG. 2 is a characteristic view showing variations in ozone remaining rate when samples heated at arbitrary temperatures in the oxidizing furnace are exposed to ozone gas. Here, the ozone remaining rate is disclosed when selecting as samples quarts, stainless steel (SUS316L), cupper, and graphite having 10 mm×10 mm size, each sample being exposed to ozone gas of flow rate of 5 sccm (200 Pa) and 15 sccm (600 Pa). It is noted that sccm means the flow rate (unit of cc) that gas in the normal condition flows for a duration of one minute.

As is clear from the results shown in FIG. 2, it can be confirmed that quartz and stainless steel (SUS316L) are optimum as materials for oxidizing-furnace upstream pipes and the oxidizing furnace, and that even when adopting such materials, the area reaching 100° C. or more is minimized preferably. From the experiment results of quartz, it can also be confirmed that, in the oxidizing furnace, increasing the ozone flow rate (flow velocity) restrains lowering of the purity of ozone gas on the downstream side of a sample to be oxidized even when a heat source is located on the upstream side thereof. In other words, this suggests that the ozone flow rate needs to increase in accordance with a heating area in the upstream area. Moreover, although SUS316L is verified, in the experiment, as a typical example of a stainless-steel material, it is clear from the experiment that a stainless steel of the same kind (SUS414, for example) can be applied as a material of an oxidizing furnace.

(2) Control of Flow of Ozone Gas and Optimization of the Flow Ate (Flow Velocity) and the Pressure Atmosphere The oxidizing velocity of a sample to be oxidized is proportional to the number of ozone molecules supplied to the surface. Therefore, the pressure gradient in the oxidizing furnace needs to be adjusted within the range that ozone does not explode so as to increase the number of molecules per unit time, which strike a sample to be oxidized.

Moreover, it is necessary to restrain the ozone dissociation rate on the upstream side of a sample to be oxidized so as to increase the remaining rate of ozone molecules among the molecules striking the sample. As for the countermeasures, since it is confirmed from the experiment (1) that the ozone survival rate is decreased when ozone strikes the surface of a material heated at 100° C. or more (note that the materials have different dissociation rates), it is seen that an optimum material, such as quartz or stainless steel, needs to be selected.

However, even when a high-temperature area cannot absolutely be eliminated on the upstream side of a sample to be oxidized (downstream one of the plurality of samples to be oxidized when simultaneously processing them), it is deemed that flow of ozone needs to be controlled so as to restrain self-dissociation reaction of ozone to a minimum until ozone molecules reaches the sample.

As for the countermeasures, the following methods are conceivable: 1) increasing the flow velocity of ozone gas to shorten time required until ozone molecules reach a sample to be oxidized, thus further extending an area where ozone survives to the downstream side (the effect of which can be confirmed from the results in FIG. 2); and 2) optimizing the flow rate of ozone gas, sectional area (structure) of the oxidizing furnace, and arrangement of a sample to be oxidized so as to make gas flow in laminar flow.

As for the method 1), it could be confirmed from the oxidation experiment using a copper plate that the plate is oxidized to copper oxide (CuO) further to the downstream side in proportion to the flow velocity of ozone (which can be confirmed since the surface of the copper plate turns black).

As for the method 2), estimation whether a current becomes laminar flow or turbulent flow can be made by the Reynolds number calculated by the following formula. It is assumed that when the value exceeds a critical value (the Reynolds number is typically about 2,000), a current passes from laminar flow to turbulent flow.

$$Re = (\sigma \cdot v \cdot h)/\mu \quad (1)$$

where Re: Reynolds number, $\rho$: fluid density, v: flow velocity (flow rate/sectional area of the oxidizing furnace), and h: narrowing effective width ($h=4r_h=4A/S$, where A: tube sectional area, and S: tube circumference length. If the section is circular, for example, $h=(4\pi r^2)/(2\pi r)$, i.e. diameter, whereas if the section is rectangular, h is twice the length of a short side).

Thus, it is seen that regardless of the section of the oxidizing furnace being cylindrical or rectangular, minimizing the diameter or the short side of the section of the oxidizing furnace is desirable in terms of the fact that turbulent flow does not occur even with setting of greater flow velocity.

Then, it is seen from the verification experiment (1) that heating of a sample to be oxidized is desirably local heating that only an area to be oxidized is heated in the oxidizing furnace. It is also seen that since longer oxidizing time produces the circumstances that the ozone molecules on the perimeter of the susceptor are apt to dissociation under the influence of heat radiation, the oxidizing time is desirably set at a minimum.

It is understood that a local heating method with indirect or direct heating is available as the heating method which satisfies such conditions. Indirect heating includes a heating method with infrared rays, for example, whereas direct heating includes a heating method with radiation heat from heating means such as a heater, for example.

Moreover, it is seen from the consideration of (2) that the pressure within the oxidizing furnace is desirably maximized within the range that the security is maintained (10,000 Pa, for example), and the flow velocity of ozone gas and the typical diameter of the oxidizing furnace are desirably determined within the range that flowing ozone gas forms laminar flow. Then, it is understood that a sample to be oxidized in the oxidizing furnace is desirably arranged so as not to disturb this laminar flow.

It is understood that the use of ultraviolet light for local heating of a sample to be oxidized allows further enhancement in oxidizing force of ozone.

In the case of oxidation using ozone, dissociation of ozone occurs when ozone strikes the surface of a sample to be oxidized, generating an oxygen atom in the ground state:

$$O_3 \rightarrow O_2 + O(^3P), \text{ where } O(^3P) \text{ is oxygen atom in the ground state} \quad (2)$$

This serves as a diffusion seed to diffuse the inside of a sample to be oxidized, forming an oxide film. It is known that an oxygen atom in the ground state has higher reactivity than that of an oxygen molecule, and thus allows high-speed oxidation at low temperature. It is noted that since dissociation reaction given in the above formula does not occur for all ozone reaching the surface, oxygen atoms need to artificially be generated by light to achieve further enhancement in oxidation efficiency.

Incidentally, it is known that ozone absorbs light in the ultraviolet region (200–300 nm). With this, an oxygen atom in the excited state occurs:

$$O_3 \rightarrow O_2 + O(^1D), \text{ where } O(^1D) \text{ is oxygen atom in the excited state} \quad (3)$$

Since an oxygen atom in the excited state has 1.96 ev higher chemical potential than an oxygen atom in the ground state, a further increase in oxidizing force is expected. In fact, higher reactivity of an oxygen atom in the excited state is verified in an application of ashing (elimination of a resist). Moreover, it is confirmed in the experiments conducted by the inventors that generation of several % oxygen atoms in the excited state just above a sample to be oxidized (wafer) enhances the oxidizing velocity of silicon.

Figure 3:
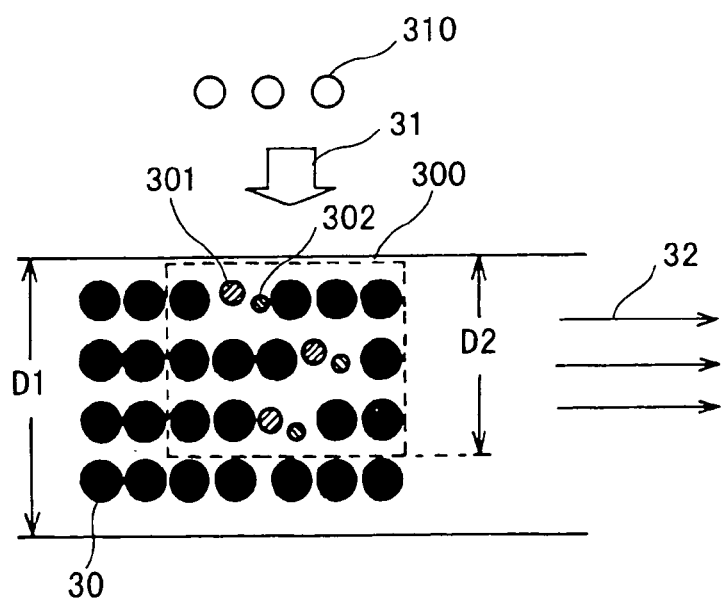
FIG. 3 is a schematic view of photodissociation of ozone when the number of molecules of ozone is greater than that of photons of ultraviolet light in the light absorption area.
Figure 4:
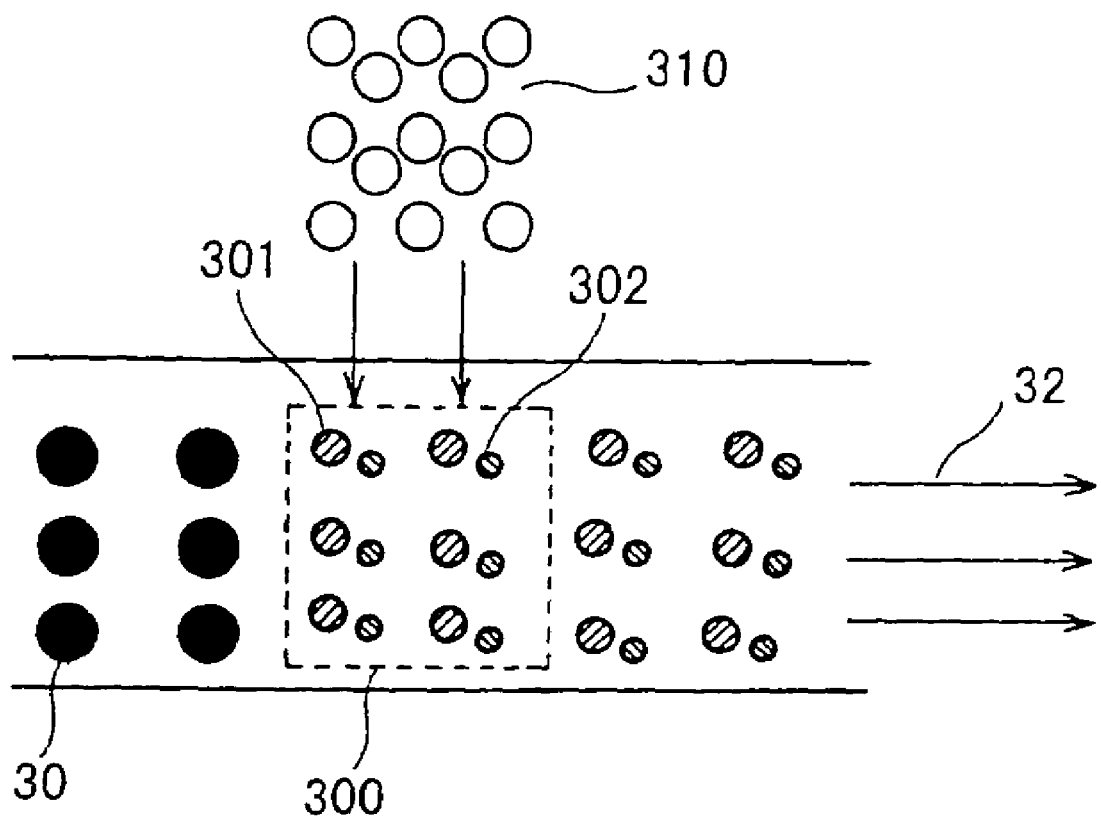
FIG. 4 is a schematic view of photodissociation of ozone when the number of photons of ultraviolet light is greater than that of molecules of ozone in the light absorption area.

FIGS. 3 and 4 are schematic views of photodissociation of ozone in the light absorption area. Particularly, FIG. 3 explains photodissociation of ozone when the number of molecules of flowing ozone is greater than that of photons of ultraviolet light in the light absorption area. FIG. 4 explains photodissociation of ozone when the number of photons of ultraviolet light is greater than that of molecules of ozone in the light absorption area. It is noted that, in FIG. 3, D1 indicates effective width of the oxidizing furnace, and D2 indicates depth of absorption (the same is applied hereafter to FIGS. 7 and 8).

Under the conditions that the number of ozone molecules 30 is greater than that of photons 310 of ultraviolet light 31 in an area 300 irradiated with ultraviolet light 31 as shown in FIG. 3, the ozone molecules 30 absorb photons 310 in accordance with the Lambert-Beer's law given in the following formula, generating photodissociation reaction given in the formula (3):

$$I = I_0 \exp^{-\alpha d} \quad (4)$$

where I: intensity of ultraviolet light after passing through an ozone layer d (cm) of 1 atmospheric pressure, $I_0$: initial intensity of ultraviolet light, and $\alpha$: absorption coefficient (about 308 cm$^{-1}$ for 254 nm light).

By way of example, at 1 atmospheric pressure (101,325 Pa), 0.008 cm absorbs 90% of incident light. Moreover, the absorption depth D2 becomes longer under decompression, e.g. 0.8 cm at 1,000 Pa.

The ozone molecules 30 existing in this area are bought into photodissociation reaction (3) in a certain probability, generating excited-state oxygen atoms 302. The fact that the Lambert-Beer's law means is that the number of photons 310 absorbed in an ozone layer of unit length perpendicular to the direction of light irradiation is constant. That is, the number of photons 310 of ultraviolet light 31 absorbed in an ozone layer flowing in laminar flow 32 is constant. Specifically, excited-state oxygen atoms 302 do not gather locally densely in a space, allowing always uniform oxidation in the surface regardless of arrangement of a sample to be oxidized (angle of the sample with respect to ozone flow).

However, excited-state oxygen atoms 302 cause readily re-bond reaction with surrounding ozone molecules 30:

$$O(^1D) + O_3 \rightarrow 2O_2 (\text{reaction constant } k=2.4\times10^{-10}(\text{cm}^3 \text{ mol}^{-1}\text{s}^{-1}) \quad (5)$$

Then, in order to increase the life of excited-state oxygen atoms 302 to reach the surface of a sample to be oxidized, it is further effective to carry out ultraviolet irradiation under the conditions that the number of applying photons 310 is greater than that of ozone molecules 30 existing in the light irradiation area (space for ozone from start of absorption of photons to full completion of absorption thereof). An example is a laser light having higher density of photons than that of a typical ultraviolet light source.

Under such conditions, all ozone molecules 30 supplied into the reaction system absorb photons fully existing in the irradiation area (light absorption area 300), and only oxygen molecules 301 and excited-state oxygen atoms 302 exist therefrom downstream (FIG. 4).

As a result, it can be reduced a loss of oxygen atoms produced until they reach the surface of a sample to be oxidized and given by the reaction formula (5). Reaction between the excited-state oxygen atom 302 and the oxygen molecule 301 includes a deactivation reaction of the oxygen atom shown by a reaction formula (6), which occurs sufficiently less as compared with the reaction formula (5). Even if it occurs, oxygen atoms in the ground state still remain, thus obtaining a sufficient effect of light irradiation.

$$O(^1D) + O_2 \rightarrow O(^3P) + O_2 (\text{reaction constant } k=4\times10^{-11} (\text{cm}^3 \text{ mol}^{-1}\text{s}^{-1}) \quad (6)$$

From the foregoing, by optimizing the ultraviolet irradiation area, ozone flow velocity, and power density (number of photons) of ultraviolet light or ultraviolet laser to create the state that the number of photons in the light irradiation area is grater than that of molecules of ozone flowing from the upstream side, excited-state oxygen atoms produced in the reaction formula (2) can be supplied to a sample to be oxidized without any deactivation over a long distance (time).

As for the tolerance of the ozone density, it was experimentally revealed that, if the ozone density at the downstream end of a sample to be oxidized is maintained at 90% or more, uniform oxidation can be achieved having film-thickness variations within 3% over the whole of an area to be oxidized.

Figure 5:
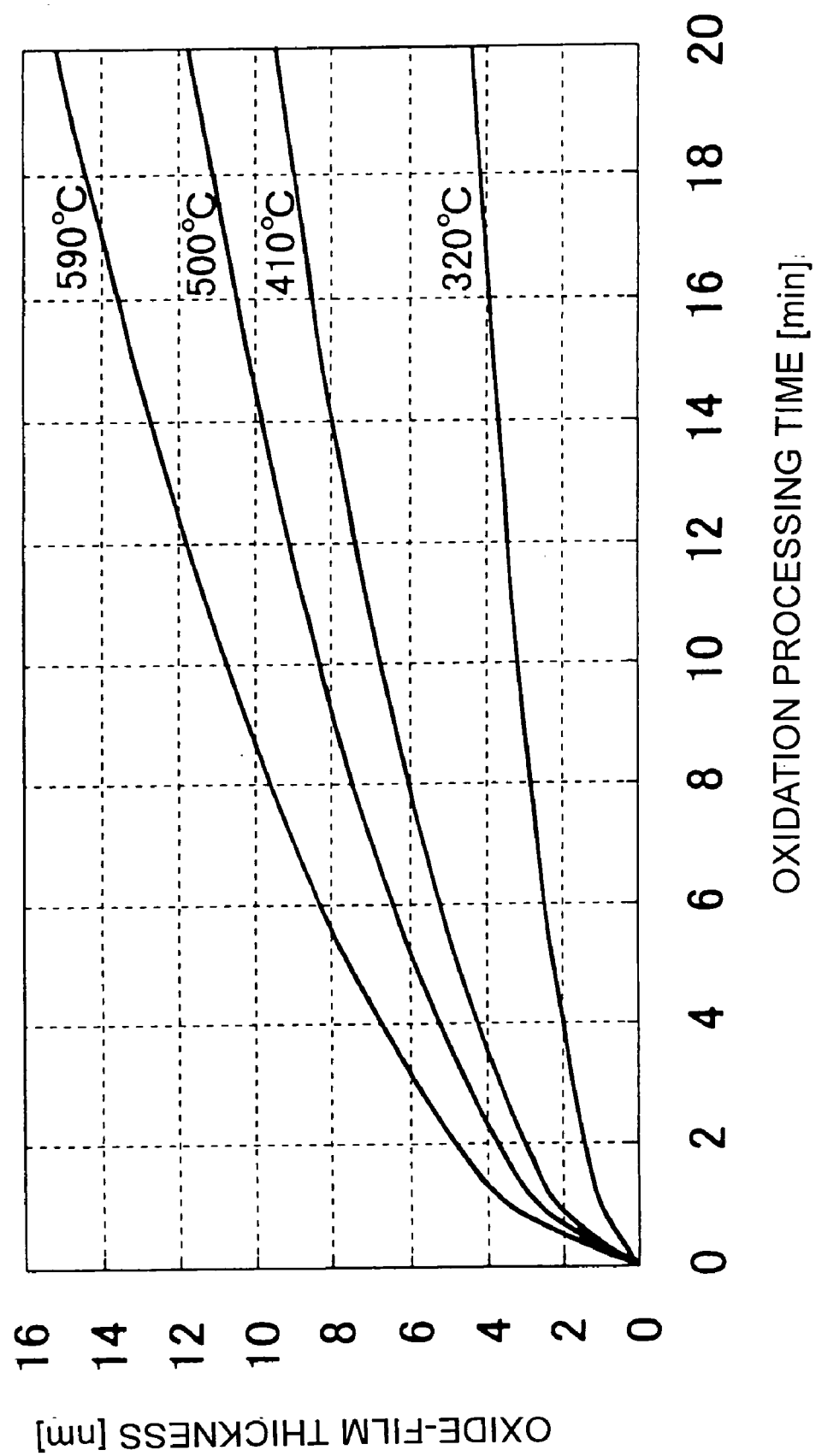
FIG. 5 is a characteristic view showing the relationship between oxidation-processing time and oxide-film thickness at predetermined temperatures of samples to be oxidized.

FIG. 5 shows the relationship between oxidation-processing time and oxide-film thickness at predetermined temperatures of samples to be oxidized. Here, when supplying ozone gas (100%) in the pressure atmosphere of 900 Pa to samples to be oxidized (n-type semiconductor, 10 mm×10 mm, 10 Ωcm) at 320–590° C., a change in thickness (nm) of an oxide film formed on the samples is shown. It is noted that the film thickness was determined by the method based on X-ray photoelectron spectrometry and elliptically polarized light analysis.

Figure 6:
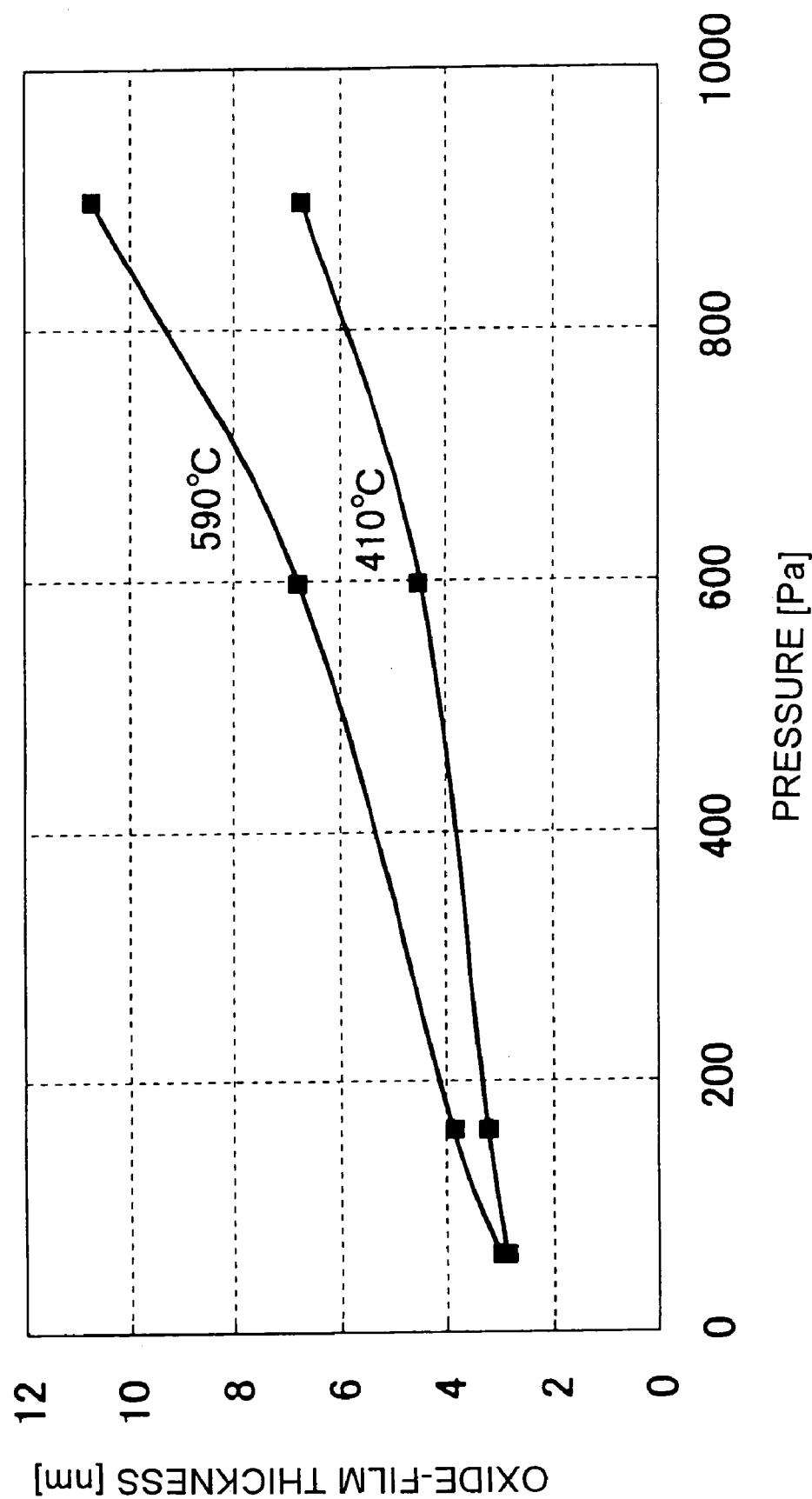
FIG. 6 is a characteristic view showing the relationship between pressure and oxide-film thickness in predetermined temperature atmospheres.

FIG. 6 shows the relationship between pressure atmosphere and oxide-film thickness in predetermined temperatures of samples to be oxidized. Samples to be oxidized and the determination method of the film thickness are the same as in the experiment in FIG. 5.

As is clear from the results shown in FIGS. 5 and 6, it can be confirmed that control of the ozone flow velocity, temperature of a sample to be oxidized, and residence time and pressure of ozone gas allows formation of an oxide film with very small and arbitrary thickness (0.5–10.0 nm, for example) on the sample.

Modes of operation of an oxide-film forming method according to the present invention, created on the basis of the above verification experiments and considerations are described with reference to the drawings. It is noted that a sample to be oxidized is a semiconductor substrate (wafer), but the sample to which the present invention is directed is not limited thereto.

(Mode of Operation 1)

Figure 7:
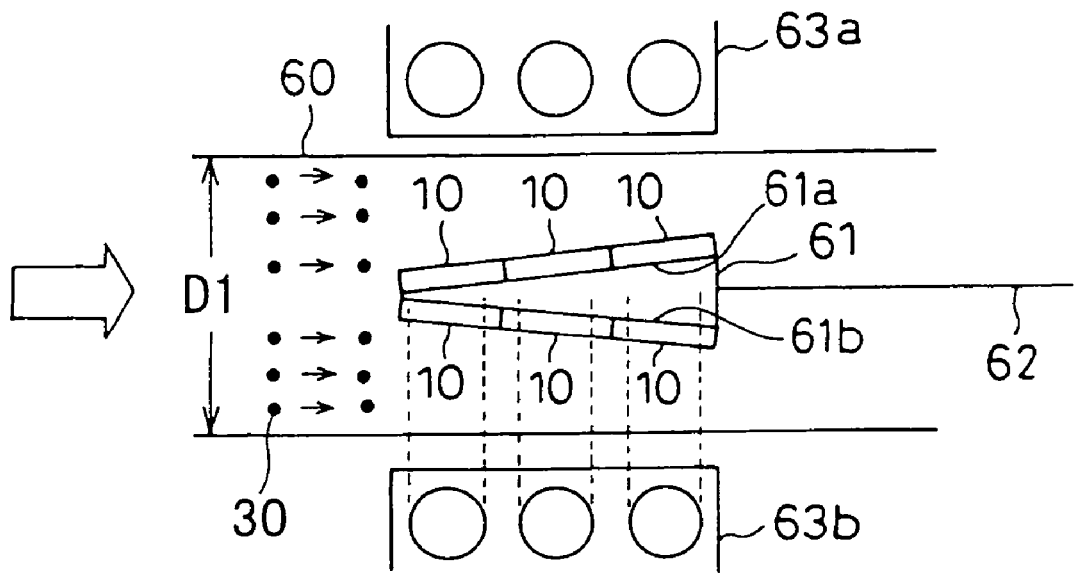
FIG. 7 is a schematic structural view of an oxidizing furnace in a mode of operation 1.

FIG. 1 is a schematic structural view showing an example of mode of operation of an oxide-film forming method according to the present invention, and FIG. 7 is a schematic structural view of an oxidizing furnace in the mode of operation.

As shown in FIG. 1, a semiconductor oxide-film forming system according to the present invention comprises ozone generating means 1, an oxidizing furnace 2, a pump 3, and an ozone-density measuring means 4.

The oxidizing furnace 2 adopts a furnace of the cold-wall type, and is provided with a light source 23. In a furnace 20 to which ozone gas is supplied, a susceptor 21 is provided to detachably fix a wafer 10 as an object to be oxidized (wafers are possible when large ozone flow rate is obtained). In the mode of operation, the susceptor 21 is supported by a support base 22.

The light source 23 emits infrared rays to locally heat the object to be oxidized in the furnace 20. The advantage of heating by the light source 23 is not only possible heating of the object to be oxidized only by local heating, but also possible oxidation in a short time due to quick temperature rise of the object. Because an increase in oxidizing time is not desirable, since it gradually increases the temperature of the surroundings of the susceptor 21 and the object to be oxidized due to heat radiation, which becomes, with a lapse of time, a cause of decreasing the ozone density until ozone reaches the object.

As the light source 23, it can be enumerated, for example, a halogen lamp, a xenon lamp, and an infrared laser such as a semiconductor laser. It is more desirable that the light source is of the quantity of irradiation light which can be set freely. The lamp is provided, preferably, with a reflecting mirror to condense light on the surface of the susceptor arranged in the center of the oxidizing furnace.

Moreover, as the light source 23, it is desirable to adopt a lamp or a laser which can generate not only infrared rays, but also bright lines (photons) in the ultraviolet region (200–300 nm, optimally, in the vicinity of 250 nm). Because ozone molecules intensely absorb photons in this wavelength region to produce excited-state oxygen atoms ($O(^1D)$) having stronger oxidizing force. As the light source in the form of a lamp, it can be enumerated, for example, a mercury lamp, mercury xenon lamp, and the like. Moreover, the semiconductor laser may be provided with a modulator which can freely modulate transmission wavelength.

The ozone-gas supply passage, the furnace 20, the susceptor 21, and the support base 21 are made of, preferably, materials which do not absorb infrared and ultraviolet rays, and more preferably, materials which have excellent ozone resistance, i.e. do not dissociate ozone (do not react with ozone). Specifically, it is adopted quartz (synthetic quartz, for example) and stainless steel (SUS316L, for example).

It is desirable that the susceptor has an inclination with respect to the direction of gas flow as required as shown in FIG. 7. It is more desirable that the angle of inclination of a susceptor 61 is set freely. Because inclining the susceptor 61 allows disturbance of gas flow on the most upstream side of the susceptor 61 to be restrained to a minimum, having the advantage of easy preservation of laminar flow above the wafer 61. In the drawing, a plurality of wafers 10 is disposed on an upper surface 61a and a lower surface 61b of the susceptor 61. Then, the light source 63a is provided to irradiate the wafers 10 on the upper surface 61a, whereas the light source 63b is provided to irradiate the wafers 10 on the lower surface 61b. The flow rate ozone gas is adjusted so that the ozone density on the surface of the wafer 10 at the downstream end (most downstream wafer 10 when having a plurality of wafers) is 90% or more. Moreover, the section (diameter or short side) of the furnace 60 is set to achieve maximum flow velocity of ozone molecules 30 while maintaining laminar flow. Such structure allows formation of an oxide film with uniform film-thickness distribution on the wafer 10. The wafer 10 is desirably disposed on the susceptor 21 to minimize exposure of the surface of the susceptor 21. This can prevent dissociation of ozone due to direct striking of ozone on the surface of the susceptor 61. Moreover, divergence of heat provided for local heating can be restrained to a minimum, resulting in a reduction in energy loss during local heating.

The pump 3 includes a pressure-reduction pump, for example, and is desirably of the adjustable flow rate. A vacuum pump is adopted as that pump, for example.

The ozone generating means 1 may be of the well-known type. It is adopted a high-purity ozone beam generator disclosed in Japanese Published Examined Patent Application 5-17164, for example.

The ozone-density measuring means 4 may also be of the well-known type. It is adopted measuring means based on the infrared analysis method and the low-temperature adsorption separation method, for example.

A general description will be made about an operation example of the semiconductor manufacturing system in the mode of operation. The system carries out the semiconductor oxide-film forming method according to the present invention through control means, not shown. Ozone gas produced by the ozone generating means 1 is introduced into the oxidizing furnace 2 by the pump 3. Then, the susceptor 21 is locally heated by the light source 23. Moreover, it is monitored the flow rate of ozone gas and the pressure within the furnace 20. The values as monitored are provided to the control means to carry out arithmetic processing for adjustment of the Reynolds number of fluid in the furnace 20, thus adjusting gas flow in the furnace 20 to form laminar flow. The oxidizing time is set in accordance with the target oxide-film thickness.

(Mode of Operation 2)

Figure 8:
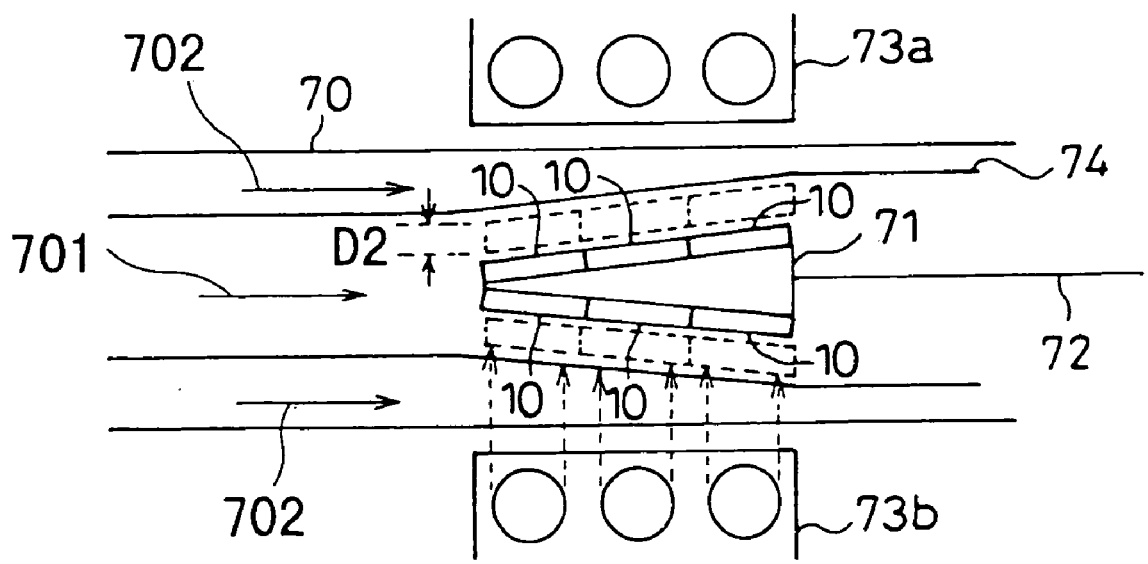
FIG. 8 is a schematic structural view of an oxidizing furnace in a mode of operation 2.

FIG. 8 is a schematic structural view of an oxidizing furnace in the mode of operation 2.

Here, ultraviolet lamps are also used together with the light source in the mode of operation 1. In FIG. 8, light source 73a, 73b include ultraviolet lamps and infrared lamps alternately arranged along the direction of flow of ozone gas.

In the same way as in the mode of operation 1, the effective width of the oxidizing furnace (distance between furnace 70 and wafer 10) is set so that the ultraviolet-light absorption area is situated in the vicinity of the surface of the wafer 10 even when the pressure of ozone gas is at a low vacuum (1,000 Pa, for example).

In the mode of operation, it is desirable that a pipe 74 is coaxially arranged in the furnace 70 to achieve double structure. Then, ozone gas 701 circulates inside the pipe 74, whereas gas 702 which does not absorb ultraviolet and infrared rays, such as oxygen, argon, or the like, circulates outside the pipe 74. When the wafer 10 is inclined in the same way as in the mode of operation 1, the pipe 74 is disposed so that the surface of the wafer 10 and the wall of the pipe 74 are in parallel to each other. By forming the pipe 74 in double structure to circulate outside cooling gas which does not absorb ultraviolet rays, it is possible not only to create oxygen atoms through photodissociation reaction produced in the vicinity of the wafer 10, but also to restrain dissociation of ozone on the surface of the pipe 74 due to less distance between the pipe 74 and the wafer 10. Thus, no problem occurs even if the distance between the pipe 74 and the wafer 10 is small. The reason of using gas which does not absorb ultraviolet rays, nor infrared rays is to prevent an influence from being exerted on heating by infrared rays. Such structure allows photodissociation to be produced in the vicinity of the surface of the wafer 10, and excited-state oxygen atoms to effectively be led to the wafer 10 even if ozone highly reactive with oxygen atom remains therearound. Moreover, the density of excited-state oxygen atoms is uniform in the whole area of the wafer 10 (another wafer as well), obtaining an oxide film having more uniform thickness.

(Mode of Operation 3)

Figure 9:
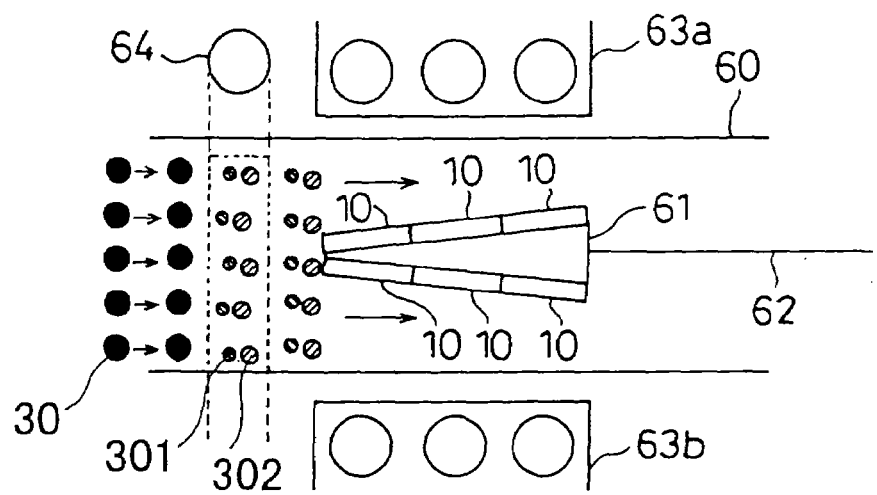
FIG. 9 is a schematic structural view of an oxidizing furnace in a mode of operation 3.

FIG. 9 is a schematic structural view of an oxidizing furnace in the mode of operation 3.

In the mode of operation, an ultraviolet light source 64 is arranged upstream of the infrared light source 63 in the semiconductor oxide-film formation system in the mode of operation 1.

It is adopted an ultraviolet lamp or an ultraviolet laser as the ultraviolet light source 64. It is adopted a lamp having great bright-line intensity on the order of 250 nm, such as a mercury xenon lamp or a mercury lamp. The ultraviolet laser includes, for example, a KrF excimer laser. The irradiation area is adjusted by using a mirror, if necessary.

In the mode of operation, in the same way as in the operation example of the mode of operation 1, flow of ozone gas is adjusted by control means, not shown, to form laminar flow. Then, the flow velocity of ozone gas is adjusted flowing above the wafer 10 as an object to be oxidized in accordance with power (number of photons) of the light source. Specifically, the number of ozone molecules entering the irradiation area per unit time is adjusted to relatively be smaller than that of photons of the light source.

In such a way, by establishing the conditions that the number of photons is greater than that of ozone molecules, ozone molecules remaining in the furnace 60 can be photodissociated roughly completely, allowing preferential residence of oxygen molecules and excited-state oxygen atoms. Then, since little ozone exists in the gaseous phase in the vicinity of the surface of the wafer 10, excited-state oxygen atoms have a long life even though generated upstream of the wafer 10, allowing supply to the surface of the wafer 10. Therefore, the position and arrangement for irradiation of ultraviolet light can be determined arbitrarily. Further, the ultraviolet light sources can be few as compared with the mode of operation 2. Furthermore, since ultraviolet light does not irradiate the wafer 10 directly, there is no need to consider damage to the wafer 10 due to irradiation of ultraviolet light.

Table 1 discloses embodiments of the present invention and a comparative example. Here, samples (10 mm×10 mm, 10 Ωcm, n-type silicon semiconductor (100 faces)) cut from a wafer are oxidized according to the semiconductor oxide-film forming methods of the present invention and the comparative example. It is disclosed measurement results of the film thickness (nm) of an oxide film formed on the samples. The sample temperature is 600° C., the oxidizing time is 10 min, the pressure within the oxidizing furnace is 600 Pa, and the ozone-gas flow rate is 10 sccm. Measurement of the temperature during wafer heating was carried out using a chromel-almel thermocouple bonded to the susceptor. Measurement of the oxide-film thickness was carried out using X-ray photoelectron spectrometry and ellipsometer (elliptically polarized light analysis). Moreover, hydrogen terminal processing is carried out immediately before introduction into the oxidizing furnace.

TABLE 1

|  | Oxide-film thickness (nm) |
| --- | --- |
| Embodiment 1 | 3.1 |
| Embodiment 2 | 3.4 |
| Comparative example | 2.2 |

In Table 1, in the embodiment 1, the samples were oxidized according to the semiconductor oxide-film forming method in the mode of operation 1. A halogen lamp (power: 400 W) was adopted as infrared light source.

In the embodiment 2, the samples were oxidized according to the semiconductor oxide-film forming method in the mode of operation 3. A halogen lamp (power: 400 W) was adopted as infrared light source, whereas a xenon mercury lamp (power: 30 mW/cm$^2$) was adopted as ultraviolet lamp.

In the comparative example, the samples were oxidized by a cold-wall type oxidizing furnace based on the prior art. A xenon mercury lamp (power: 30 mW/cm$^2$) was adopted as ultraviolet lamp.

As is clear from the results in Table 1, it can be confirmed that the semiconductor oxide-film forming method according to the present invention allows high-speed and efficient formation of a semiconductor oxide film as compared with the conventional example.

In the embodiment 2, it was confirmed that the photon absorption rate of ozone molecules is 10%, and the photodissociation of ozone gas is 10%. Therefore, it is evident that, in the embodiment 2, by controlling the flow velocity of ozone gas and the light quantity of ultraviolet light so that the photon absorption rate of ozone molecules is 100%, and the photodissociation of ozone gas is 100%, the embodiment produces more prominent effect.

(Mode of Operation 4)

Figure 10:
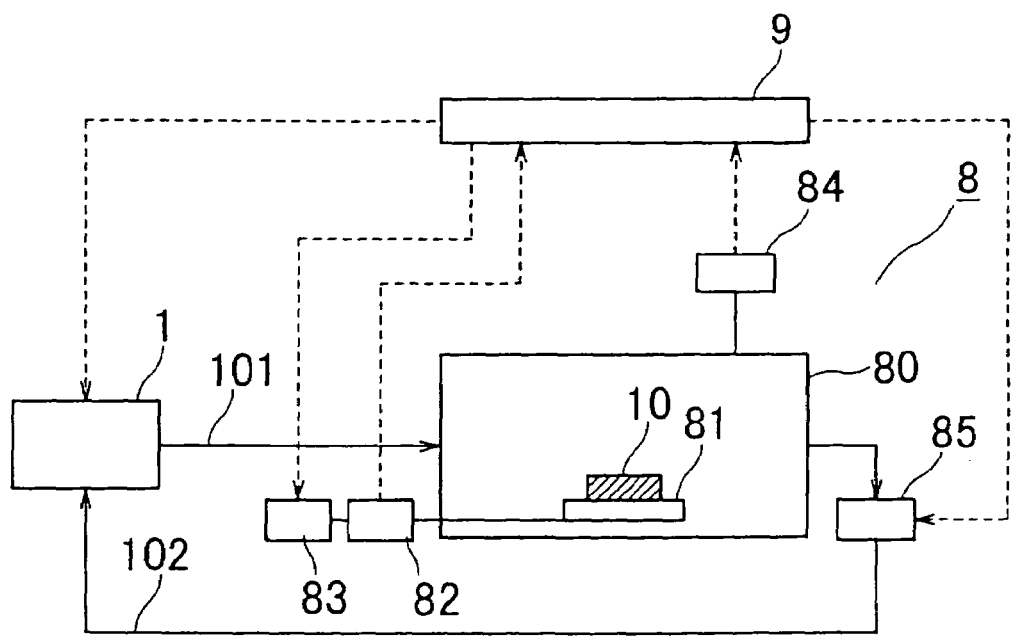
FIG. 10 is a schematic view showing a mode of operation 4.

FIG. 10 is a schematic view showing the mode of operation 4 of the present invention. Similar signs are given to structural means similar to the means described in FIG. 1, and the descriptions thereof are omitted appropriately.

In the mode of operation, a sample to be oxidized is locally heated based on the direct heating method. Then, while locally heating the sample to be oxidized under a constant pressure, ozone gas is supplied to the sample.

The ozone generating means 1 are means for supplying ozone gas to a processing furnace. The ozone generating means 1 may be of the well-known type, preferably, the type capable of supplying 100% ozone gas. It can be enumerated, for example, high-purity ozone beam generator disclosed in Japanese Published Examined Patent Application 5–17164 described in the mode of operation 1.

The oxidizing furnace 8 is means for exposing a sample to be oxidized (wafer 10) to ozone gas under constant temperature and pressure to thereby form an oxide film on the surface of the sample. It is provided with pressure measuring means 84 and pressure adjusting means 8. Connected to the oxidizing furnace 8 are a path 101 for introducing ozone gas supplied from the ozone generating means 1 and a path 102 for discharging gas in the furnace. The pressure measuring means 84 are provided with the oxidizing furnace 8, whereas the pressure adjusting means 85 are arranged on the path 102. A piping material of the path 102 is desirably a material not subjected to oxidation decomposition by ozone, e.g. electropolished stainless steel and the like. The path 102 is connected to the ozone supplying means 1 so as to feed gas discharged from the oxidizing furnace 8 for generation of ozone gas.

A cold-wall type furnace 80 is adopted as the oxidizing furnace 8. In FIG. 10, the oxidizing furnace 8 is constructed to introduce ozone gas from the lateral direction (parallel with respect to the surface to be oxidized). However, the introduction form is not limited thereto, and ozone gas may be introduced from the vertical direction (vertical direction with respect to the surface to be oxidized). In the mode of operation as well, in the same way as in the modes of operation 2 and 3, the light source generating ultraviolet rays may be provided with the oxidizing furnace 8.

The oxidizing furnace 8 comprises in the furnace 80a a susceptor 81 having a sample to be oxidized disposed thereon (samples are possible when large ozone flow rate is secured) is detachably disposed. The susceptor 81 heats the sample to be oxidized (wafer 10). The susceptor 81 is directly heated by heating means 83 such as a heater. Then, the temperature of the susceptor 80 is monitored by temperature measuring means 82, and is adjusted appropriately by control means 9. The same material as that of the susceptor 21 as described above is adopted as the material of the susceptor 81. The susceptor 81 may be arranged in the oxidizing furnace 2 with inclination with respect to the direction of gas flow as in the modes of operation 1–3. It is apparent from the descriptions of the modes of operation 1–3 that the sample to be oxidized is desirably disposed to conceal the susceptor 81 so as to prevent exposure of a high-temperature portion of the susceptor locally heated.

The pressure measuring means 84 measure the pressure within the furnace 80. A pressure value as measured is provided to the control means 9 for controlling the pressure within the furnace 80.

The pressure adjusting means 83 control the pressure within the furnace 80 in accordance with a control signal provided from the control means 9. The pressure control means 23 include, for example, valve means for adjusting the opening degree of the path 11 in accordance with a control signal provided from the control means 3.

The control means 8 control the temperature of the susceptor 81 and the pressure adjusting means 82 through arithmetic processing in accordance with measurement signal provided from the temperature measuring means 82 and the pressure measuring means 84. The temperature of the susceptor is controlled, for example, at 100–400° C. Moreover, the pressure adjusting means 84 are operatively controlled so that the pressure within the furnace 80 is, for example, between 100 and 44,000 Pa.

Figure 11:
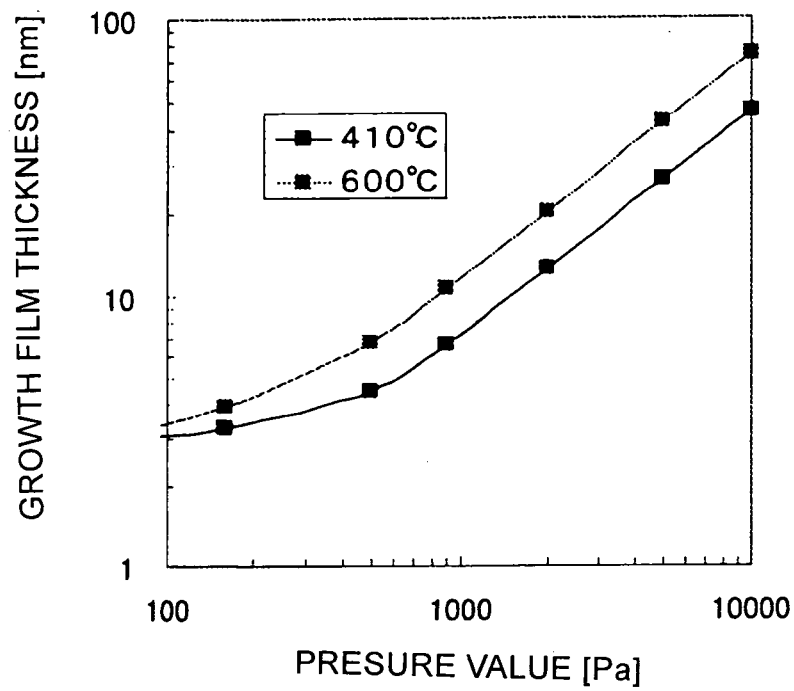
FIG. 11 is a characteristic view showing the relationship between pressure value and oxide-film thickness.

FIG. 11 is a characteristic view showing the relationship between the pressure within the oxidizing furnace and the growth film thickness of an oxide film formed on a sample to be oxidized. Here, the characteristics are shown when a sample to be oxidized is an n-type Si (100), the oxidizing time is 10 min, and the saturated flow rate of ozone is 20 sccm. It is noted that the number in parentheses designates a face index. As is clear from the drawing, it can be confirmed that, with 4 nm or more oxide-film thickness, the oxidation growth rate is strictly controlled in the ozone atmosphere. Moreover, it was revealed that the oxide-film thickness is proportional to $0.08^{th}$ power of the pressure when the ozone flow rate is saturated (here, it is saturated at 20 sccm). Therefore, when conducting processing at 410° C., for example, setting of the pressure within the processing furnace at 10,000 Pa allows preparation of an oxide film having 50 nm film thickness for 10 min. As will be described later, since the oxidizing velocity has small silicon face azimuth anisotropy in the wide range of throughput, it is predicted that polysilicon can be processed at equivalent rate. Moreover, as is clear from the results in the drawing, since the film-forming rate (throughput) of an oxide film is as great as that of film formation according to the CVD, the present invention can be alternate means of the CVD process.

Figure 12:
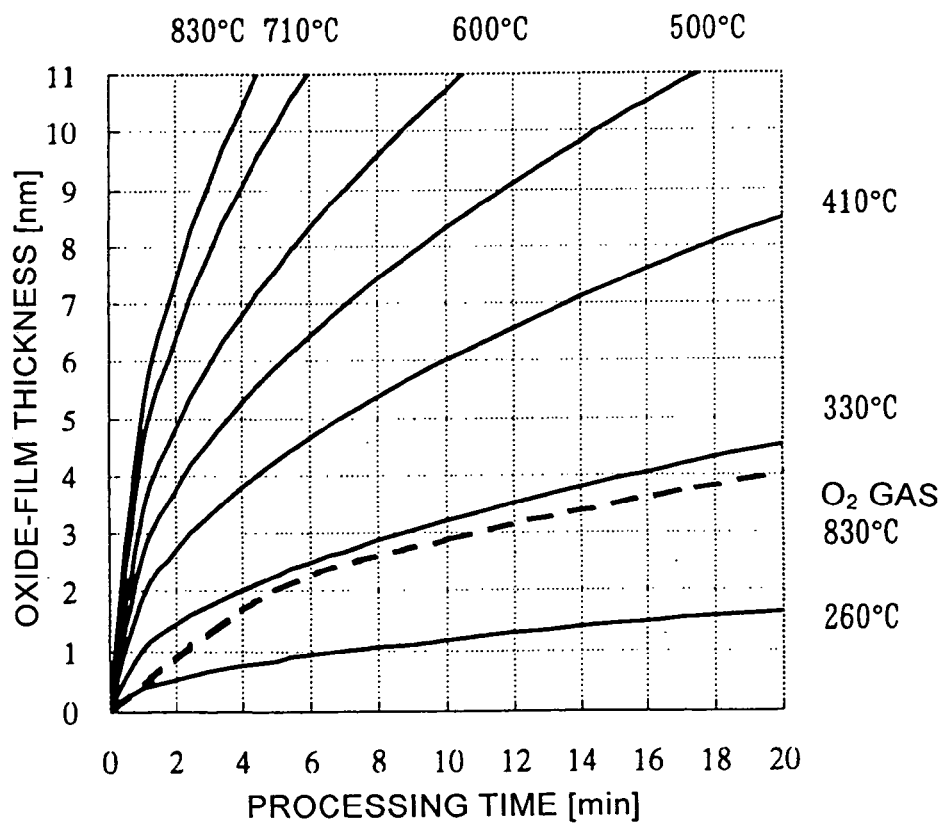
FIG. 12 is a characteristic view showing the relationship between processing time and oxide-film thickness.

FIG. 12 is a characteristic view showing the relationship between processing time and oxide-film thickness. Here, the relationship between the processing time and the oxide-film thickness is shown when the temperature range is between 260 and 830° C., the saturated flow rate of ozone is 20 sccm, and the oxidation pressure is 900 Pa. Moreover, as a comparative example, the characteristics are shown when processing is carried out at 830° C. in the oxygen atmosphere.

As is clear from FIG. 12, it can be confirmed that, though in the reduced pressure state, the oxidizing velocity when processing is carried out in the ozone-gas atmosphere is remarkably higher than that when processing is carried out in the oxygen atmosphere. It was confirmed that, at 600° C., for example, a 6 nm oxide film can be formed within 3 min. It was also confirmed that, since oxygen atoms derived from ozone form diffusion seeds, the temperature conditions in the ozone atmosphere can be improved to reduce the temperature by 500° C. or more (830–330° C.) with respect to the temperature conditions in the oxygen atmosphere. Even when restriction on the processing temperature (400° C. or less) exists such as in the case of film forming on glass, sufficient film-forming rate can be obtained even at low temperature by combining 100% ozone gas and the reduced-pressure cold-wall processing furnace. In such a way, it is assumed that diffusion of diffusion seeds forms rate-determining in oxide-film formation on a sample to be oxidized. It is deemed that the relationship between the oxide-film thickness and the oxidizing time is expressed by the following formula:

$$X^2 = Bt$$

$$B = C \exp(-Ea/kT)$$

where X: growth oxide-film thickness, B: rate constant, t: oxidizing time, C: constant, Ea: activation energy of oxidation, k: Boltzmann's constant, and T: absolute temperature.

Figure 13:
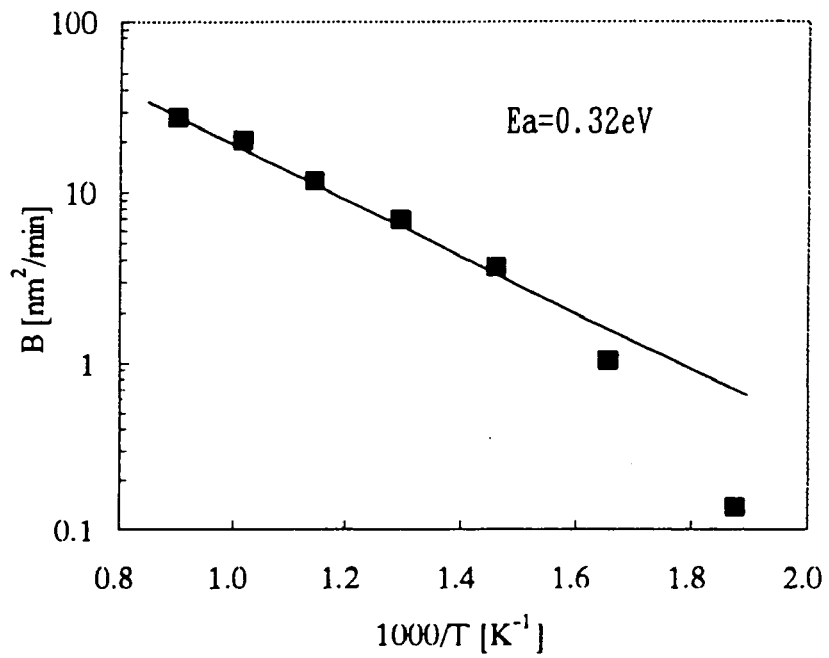
FIG. 13 is a characteristic view showing the relationship between rate constant (B) and absolute temperature (T)

FIG. 13 shows the relationship between rate constant (B) and absolute temperature (T).

It was calculated from Arrhenius plot as shown that the activation energy Ea resulting from oxygen atoms is 0.32 eV. Then, it was also confirmed that the calculated value is about ¼ the activation energy (1.2 eV) resulting from oxygen molecules. This suggests that oxygen atoms are more diffusible than oxygen molecules with respect to a surface to be oxidized, and the oxidizing velocity has less temperature dependence. Less temperature dependence of the oxidizing velocity means less influence from variations in temperature of the susceptor having a sample to be oxidized disposed thereon. Thus, the uniformity of the film thickness is easy to achieve even by the cold-wall type processing furnace which is relatively difficult in uniform temperature control of a sample to be oxidized. Therefore, with the oxide-film forming method according to the present invention, oxidation providing uniform film thickness in the processed surface, equivalent or superior to the prior art, can be achieved even by the cold-wall type having control level of the temperature uniformity inferior to the hot-wall type.

Moreover, it was confirmed that the present invention allows formation of an ideal oxide film due to reactivity and mobility of oxygen atoms which form diffusion seeds. That is, it is confirmed from an experiment in FIG. 14 as will be described later that the stationary electric-charge density of an interface of an oxide film obtained in the ozone-gas atmosphere of 400° C. and the interface order density thereof are roughly equivalent to those of an oxide film obtained in the hot oxygen atmosphere of 1,000° C.

Figure 14:
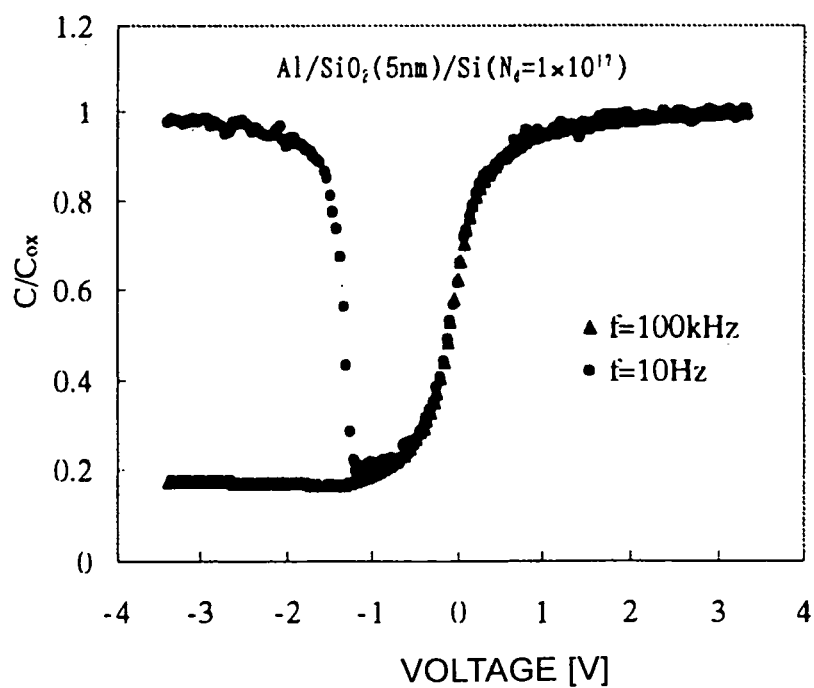
FIG. 14 is a characteristic view showing high-frequency and low-frequency C-V characteristics of an oxide film formed according to the present invention.

FIG. 14 is a characteristic view showing high-frequency and low-frequency C-V characteristics of an oxide film. Here, it is shown the C-V characteristics of a 5 nm oxide film ($SiO_2$) formed under the heating conditions of 410° C. The interface order density (Dit) and the stationary electric-charge density (Nf) obtained from the high-frequency and low-frequency C-V curves are $5\times10^{10}$($cm^{-2}$/eV) and $1\times10^{11}$ ($cm^{-2}$), respectively. The values are roughly equivalent to those of the C-V characteristics of an oxide film formed in the oxygen atmosphere on the order of 1,000° C. It is assumed that this is due to reactivity of oxygen atoms as free radicals. Specifically, since oxygen atoms liberated from ozone are rich in reactivity and diffusivity, the interface of a sample to be oxidized can completely be passivated, even under the low-temperature conditions of 400° C., to the same extent as oxidation by oxygen molecules at 1,000° C. without maintaining the state of Si+, Si2+, and Si3+ of suboxides. In such a way, since the present invention allows formation of an ideal $SiO_2$/Si interface, ideally low leakage current and high withstand voltage are achieved even with a thin film of 10 nm or less.

Figure 15:
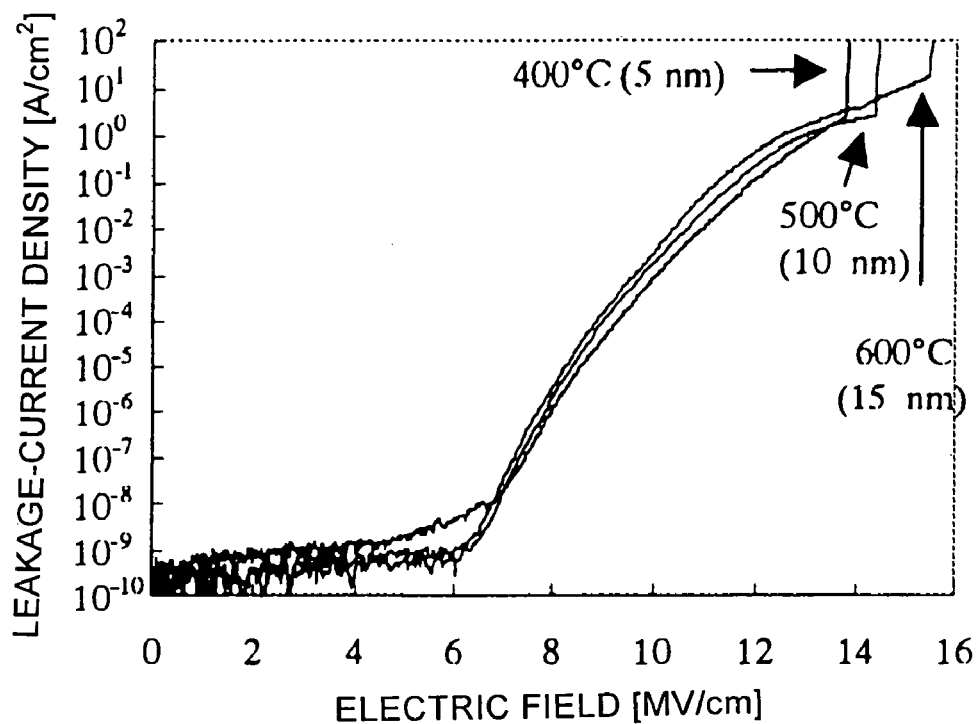
FIG. 15 is a characteristic view showing J-E characteristics when applying the positive voltage to an Al electrode.

FIG. 15 is a characteristic view showing J-E characteristics when applying the positive voltage to an Al electrode. Here, it is shown the J-E characteristics of oxide films (5 nm, 10 nm, and 15 nm) formed under the heating conditions of 400° C., 500° C., and 600° C. As is clear from the results in FIG. 6, it is seen that, regardless of the temperature conditions, the withstand voltage of the oxide film as formed is excellent or on the order of 14 MV/cm or more. It was confirmed that the withstand voltage is higher than that of an oxide film with the same film thickness obtained in the hot oxygen atmosphere. The behavior of leakage current of the oxide film as obtained can be explained by an FN (Fowler-Nordheim) tunnel mechanism shown by the following formula in the range that the electric field is 6–14 MV/cm:

$J=AE^2\exp(-B/E)$ $B=6.83\times10^7\cdot(mox/m)^{1/2}\cdot\phi o^{3/2}$ where J is current density, A is constant, E is electric field, m is mass of a free electron, mox is mass of a free electron of an oxide, and φo is barrier height.

Figure 16:
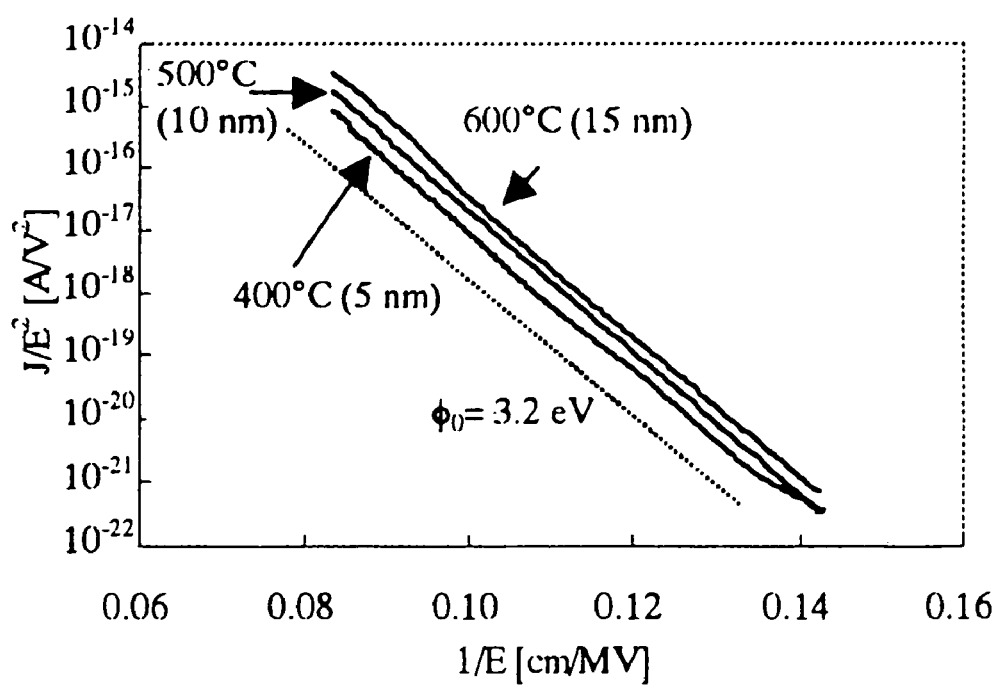
FIG. 16 is an FN (Fowler-Nordheim) plot diagram.

FIG. 16 is an FN (Fowler-Nordheim) plot diagram. The barrier height between Si and $SiO_2$ is obtained from the inclination of a straight line as illustrated. In the drawing, assuming that the barrier height of an interface between $SiO_2$ and Si is 3.2 eV (ideal value), all behaviors of leakage current can be explained. Specifically, it can be confirmed from FIG. 16 that an ideal interface can be formed even when a $SiO_2$ film is thin, or the preparation temperature is 400° C. or in considerably low condition.

Moreover, it is confirmed that, in the present invention, the oxidizing velocity of a sample to be oxidized does not depend on the face azimuth.

Figure 17:
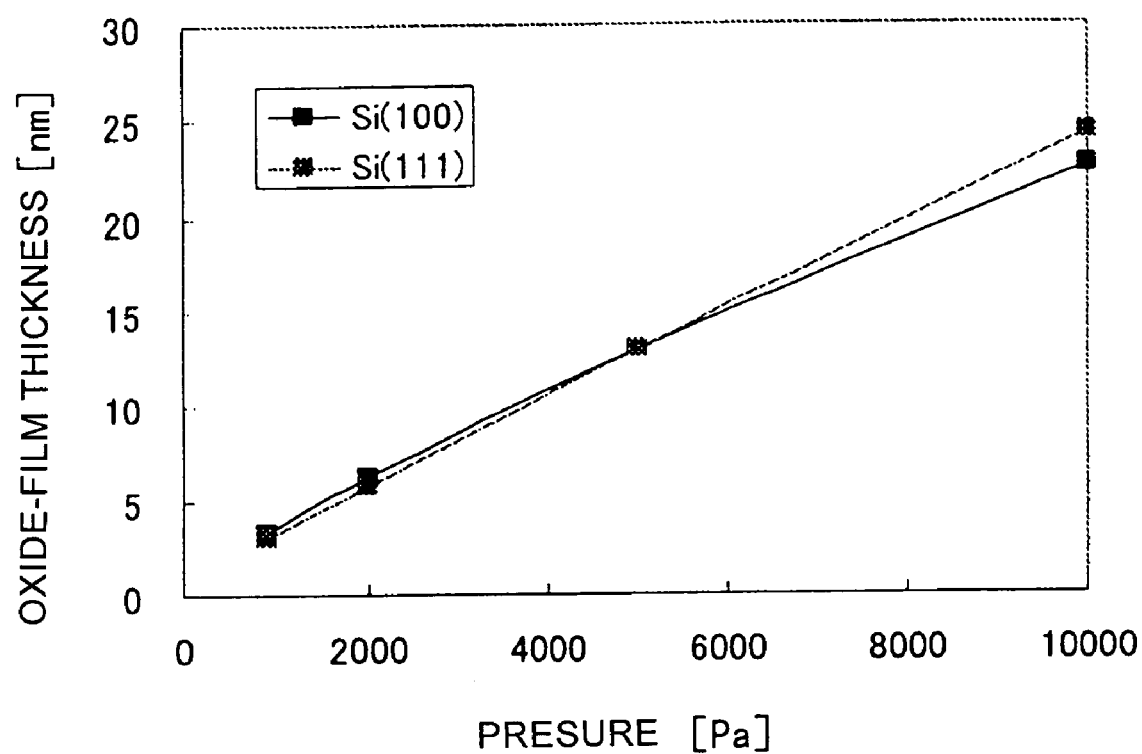
FIG. 17 is a characteristic view showing the relationship between processing pressure and film thickness.

FIG. 17 is a characteristic view showing the relationship between processing pressure and film thickness. Here, polysilicon is used as a sample to be oxidized, and is subjected to ozone processing at 410° C. In the drawing, the number in parentheses such as Si (100) and Si (111) means a face index. As is clear from the results in FIG. 17, the growth rate of the oxide-film thickness has little face azimuth dependence. Therefore, uniform oxidation of a sample to be oxidized can be obtained by controlling the pressure.

Moreover, it was confirmed that, even after forming an oxide film in the hot oxygen atmosphere, post ozone processing in the atmosphere of 400–600° C. allows an improvement in electric characteristics. That is, the results of XPS analysis after post ozone processing revealed a reduction in $Si^{3+}$ and $Si^{2+}$ of an oxide film. Moreover, it was confirmed a reduction in interface order density, stationary electric-charge density, and leakage current and an improvement in withstand voltage. When reforming a 10 nm thermal oxide film, for example, an example of post ozone processing is processing in the ozone atmosphere of 900 Pa, at 600° C., and for 9 min (conditions of formation of a 10 nm ozone film).

The technique of the present invention described above in connection with the modes of operation allows, though very low temperature process, preparation of a high-quality silicon oxide thin film. Thus, it can be expected application to various oxidation processes such as application to preparation process of a gate oxide-film of a thin film transistor (TFT) as well as application to preparation process of a high-performance gate oxide film for nonvolatile memory typified by flash memory. That is, having a film thickness which is several times greater than that of the most advanced logical device and DRAM device on the order of 2 nm, a gate oxide film for nonvolatile memory is required to provide high reliability such as low leakage-current value, high breakdown voltage, or the like. Thus, it is expected that the technique of the present invention described in connection with the modes of operation makes a start on solving the problems.

Having described above, when carrying out oxidation processing of a sample to be oxidized, the oxide-film forming method of the present invention and the system thereof allow high-speed and efficient formation of an oxide film, uniform and improved film thickness thereof at relatively low temperature, and enhancement in electric characteristics thereof.

That is, according to the present invention, since only a sample to be oxidized is heated locally, thermal dissociation of ozone is restrained to a minimum on the upstream side of the sample, allowing supply to the sample while maintaining roughly 100% ozone concentration.

Further, local heating of the present invention allows quick increase in the temperature of a sample to be oxidized in a short time, achieving not only reduction in oxidizing time, but also restraint of ozone dissociation due to temperature rise of the surroundings of the surface of the sample with heat radiation, resulting in oxidation processing ability maintained.

Still further, supply of ozone gas in the state of laminar flow allows not only reduction in ozone dissociation rate per unit length in the flow direction, but also arrangement pf a plurality of samples to be oxidized in the ozone flow direction, thus enhancing the throughput, resulting in increased mass productivity.

Furthermore, in combination with ultraviolet irradiation, excited-state oxygen atoms produced by ultraviolet light based on photodissociation of ozone are subjected to oxidation processing, allowing further high-speed and efficient formation of an oxide film.

Further, according to the present invention, the oxidizing velocity can arbitrarily be controlled by the pressure within the processing system.

Still further, according to the present invention, all the oxidation seeds involved in oxidation of a sample to be oxidized are neutral in terms of thermal energy, causing no damage to an oxide film due to high energy and ion seeds.

Still further, when forming an oxide film on a sample to be oxidized, the heating temperature can be reduced by 500° C. or more as compared with thermal oxidation processing with oxygen gas, achieving formation of the oxide film at low cost.

Further, according to the present invention, the temperature dependence of the oxidizing rate is ¼ or less of that of the oxidizing rate with oxygen gas, so that an oxide film having uniform film thickness can be prepared even by the cold-wall type oxidizing furnace which is more difficult in uniform temperature control than the hot-wall type oxidizing furnace. Moreover, the oxidizing velocity of a sample to be oxidized has little face azimuth dependence, allowing preparation of a good-quality insulating film.

Furthermore, an oxide film obtained according to the present invention has electric characteristics equivalent or superior to that obtained through oxidation at 1,000° C. Particularly, it has ideally low leakage current when applying high electric field to a film even with small film thickness, and also has higher withstand voltage than that of an oxide film obtained with hot oxygen gas.

Furthermore, applying the present invention to a finished oxide film allows an improvement in the film quality (compactness by passivation of oxygen atoms). Moreover, applying the present invention to the process currently conducted in the CVD for preparing a silicon insulating film of silicon allows a greatly good-quality oxide film. Then, post annealing process is not needed in any case.

The invention claimed is:

1. An oxide film forming method wherein ozone gas is exposed to a sample to be oxidized to thereby form an oxide film on a surface of the sample, comprising:
   providing ozone gas to the sample to be oxidized while locally heating an area of the sample to be oxidized in a furnace to which ozone gas is supplied, and
   adjusting a pressure within the furnace within a range of 100 to 44,000 Pa to thereby control an oxidizing velocity of the sample.

2. The oxide film forming method as specified in claim 1, wherein the ozone gas comprises a gas of about 100% ozone concentration.

3. The oxide film forming method as specified in claim 1, wherein in infrared light is irradiated to the area to be oxidized of the sample to be oxidized to thereby heat the area locally.

4. The oxide film forming method as specified in claim 1, wherein the sample to be oxidized is disposed on a susceptor, wherein the susceptor is heated to thereby heat the area to be oxidized of the sample to be oxidized locally.

5. The oxide film forming method as specified in claim 4, wherein the susceptor is inclined with respect to a direction of ozone gas flow.

6. The oxide film forming method as specified in claim 4, wherein samples are disposed on an upper surface of the susceptor and samples are disposed on a lower surface of the susceptor.

7. The oxide film forming method as specified in claim 4, wherein the susceptor is wedge-shaped, with a point of the wedge facing a flow of the ozone gas.

8. The oxide film forming method as specified in claim 1, wherein ozone gas is supplied to the area to be oxidized of the sample in a state of laminar flow.

9. The oxide film forming method as specified in claim 1, wherein ultraviolet light is further irradiated to the area to be oxidized of the sample to be oxidized.

10. The oxide film forming method as specified in claim 1, wherein ozone gas is exposed to ultraviolet light, then supplied to the area to be oxidized of the sample.

11. The oxide film forming method as specified in claim 1, wherein only the sample to be oxidized is heated.

12. The oxide film forming method as specified in claim 1, wherein ozone gas is supplied to the area to be oxidized of the sample in a state of laminar flow.

13. An oxide film forming method wherein ozone gas is exposed to a sample to be oxidized to thereby form an oxide film on a surface of the sample, comprising:
   providing ozone gas comprising a gas of about 100% ozone concentration,
   adjusting a pressure within a furnace to which ozone gas is supplied within a range of 100 to 44,000 Pa, to thereby control an oxidizing velocity of the sample, and
   locally heating an area of the sample to be oxidized while ozone gas is supplied to the sample to be oxidized.

14. An oxide film forming method wherein ozone gas is exposed to a sample to be oxidized to thereby form an oxide film on a surface of the sample, comprising:
   adjusting a pressure within a furnace to which ozone gas is supplied within a range of 100 to 44.000 Pa to thereby control an oxidizing velocity of the sample,
   locally heating an area of the sample to be oxidized while supplying ozone gas to the sample to be oxidized, and
   adjusting a flow rate of said ozone gas to allow an ozone concentration downstream of the sample to be maintained at 90% or more.

15. An oxide film forming system wherein ozone gas is exposed to a sample to be oxidized to thereby form an oxide film on a surface of the sample, comprising:
   a supply of ozone gas,
   a furnace to which said ozone gas is supplied and in which the sample to be oxidized is disposed, the furnace having a gas pressure therein.
   a heater for locally heating said sample, and
   pressure adjusting apparatus for making the pressure within said furnace adjustable within a range of 100 to 44,000 Pa to thereby control an oxidizing velocity of the sample.

16. The oxide film forming system as specified in claim 15, wherein the heating means include a light source for emitting infrared rays that are irradiated to the sample to be oxidized to thereby heat the sample locally.

17. The oxide film forming system as specified in claim 16, wherein the heating means comprise a light source for emitting ultraviolet light.

18. The oxide film forming system as specified in claim 16, wherein said light source for emitting infrared rays has a function of emitting ultraviolet rays.

19. The oxide film forming system as specified in claim 15, wherein the heating means comprise a susceptor having said sample to be oxidized disposed thereon and for heating the sample.

20. The oxide film forming system as specified in claim 15, further comprising a light source for irradiating the ozone gas with ultraviolet light, wherein the light source is arranged upstream of said sample to be oxidized.

21. The oxide film forming system as specified in claim 15, further comprising a pipe for circulating ozone gas, wherein gas which does not absorb ultraviolet and infrared rays is circulated outside the pipe and the sample to be oxidized is disposed inside the pipe.

22. An oxide film forming system wherein ozone gas is exposed to a sample to be oxidized to thereby form an oxide film on a surface of the sample, comprising:
a supply of ozone gas,
a furnace to which said ozone gas is supplied and in which the sample to be oxidized is disposed in a way inclined with respect to a direction of gas flow, the furnace having a gas pressure therein,
a heater for locally heating said sample, and
pressure adjusting apparatus for making a value of pressure within said furnace adjustable within a range of 100 to 44,0000 Pa to thereby control an oxidizing velocity of the sample.

* * * * *

UNITED STATES PATENT AND TRADEMARK OFFICE
CERTIFICATE OF CORRECTION

| | | |
|---|---|---|
| PATENT NO. | : 7,214,412 B2 | Page 1 of 1 |
| APPLICATION NO. | : 10/494691 | |
| DATED | : May 8, 2007 | |
| INVENTOR(S) | : Tetsuya Nishiguchi, Hidehiko Nonaka and Shingo Ichimura | |

It is certified that error appears in the above-identified patent and that said Letters Patent is hereby corrected as shown below:

The Title of the Invention should read as follows:: item (54);

OXIDE-FILM FORMING METHOD AND SYSTEM THEREOF

Signed and Sealed this

Third Day of July, 2007

JON W. DUDAS
*Director of the United States Patent and Trademark Office*